(12) United States Patent
Kishi et al.

(10) Patent No.: US 6,831,855 B2
(45) Date of Patent: Dec. 14, 2004

(54) MAGNETIC MEMORY

(75) Inventors: Tatsuya Kishi, Kanagawa-ken (JP);
Minoru Amano, Kanagawa-ken (JP);
Yoshiaki Saito, Kanagawa-ken (JP);
Shigeki Takahashi, Kanagawa-ken (JP); Katsuya Nishiyama,
Kanagawa-ken (JP); Yoshiaki Asao, Kanagawa-ken (JP); Hiroaki Yoda,
Kanagawa-ken (JP); Tomomasa Ueda, Kanagawa-ken (JP); Yoshihisa Iwata,
Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 8 days.

(21) Appl. No.: 10/345,188

(22) Filed: Jan. 16, 2003

(65) Prior Publication Data
US 2003/0156476 A1 Aug. 21, 2003

(30) Foreign Application Priority Data
Jan. 16, 2002 (JP) .............................. 2002-007878

(51) Int. Cl.$^7$ .............................................. G11C 11/00
(52) U.S. Cl. ......................................... 365/158; 365/171
(58) Field of Search .................................. 365/171, 158

(56) References Cited

U.S. PATENT DOCUMENTS

| | | | |
|---|---|---|---|
| 5,659,499 A | 8/1997 | Chen et al. | 365/158 |
| 5,956,267 A | 9/1999 | Hurst et al. | 365/158 |
| 6,211,090 B1 | 4/2001 | Durlam et al. | 438/692 |
| 6,473,336 B1 * | 10/2002 | Nakajima et al. | 365/171 |

OTHER PUBLICATIONS

U.S. Appl. No. 10/345,188, Kishi et al., filed Jan. 16, 2003.
U.S. Appl. No. 10/767,997, Yoda et al., filed Feb. 2, 2004.

* cited by examiner

Primary Examiner—M. Tran
(74) Attorney, Agent, or Firm—Oblon, Spivak, McClelland, Maier & Neustadt, P.C.

(57) ABSTRACT

A magnetic memory includes: a magnetoresistance effect element having a magnetic recording layer; a first writing wiring extending in a first direction on or below the magnetoresistance effect element, a center of gravity of an axial cross section of the wiring being apart from a center of thickness at the center of gravity, and the center of gravity being eccentric toward the magnetoresistance effect element; and a writing circuit configured to pass a current through the first writing wiring in order to record an information in the magnetic recording layer by a magnetic field generated by the current.

25 Claims, 20 Drawing Sheets

MAGNETIC MEMORY

CROSS-REFERENCE TO RELATED APPLICATIONS

This application is based upon and claims the benefit of priority from the prior Japanese Patent Application No. 2002-007878, filed on Jan. 16, 2002; the entire contents of which are incorporated herein by reference.

BACKGROUND OF THE INVENTION

This invention relates to a magnetic memory, and more particularly, to a magnetic memory which can reduce power consumption by applying a magnetic field to a record layer of the magnetoresistance effect element efficiently by small write-in current.

Recently, there is a proposal of magnetic random access memory using a magnetic element exhibiting giant magnetoresistance effect as a solid magnetic storage device. Especially, magnetic memory using "ferromagnetic tunnel junction" is remarked as a magnetic element.

Ferromagnetic tunnel junction is mainly made of a three-layered film of first ferromagnetic layer/insulating film/second ferromagnetic layer, and a current flows, tunneling through the insulating film. In this case, the junction resistance value varies proportionally to the cosine of the relative angle between magnetization directions of the first and second ferromagnetic layers. Therefore, resistance value becomes minimum when the magnetization directions of the first and second ferromagnetic layers are parallel, and becomes maximum when they are anti-parallel. This is called tunneling magnetic resistance (TMR) effect. For example, in the literature, Appl. Phys. Lett., Vol. 77, p 283(2000), it is reported that changes of resistance value by TMR effect reaches as high as 49.7% at the room temperature.

In a magnetic memory including a ferromagnetic tunnel junction as a memory cell, magnetization of one of ferromagnetic layers is fixed as a "reference layer", and the other ferromagnetic layer is used as a "recording layer". In this cell, by assigning parallel and anti-parallel magnetic orientations of the reference layer and the recording layer to binary information "0" and "1", information can be stored.

For writing information, magnetization of the recording layer is reversed by a magnetic field generated by supplying a current to a write line provided for the cell. In many cases, magnetization reversal is performed by passing write-in current simultaneously to two write-in wirings which cross each other without touching, and thereby applying a synthetic magnetic field in the direction which has a certain angle which is not zero to a magnetization easy axis of a memory layer.

Moreover, in the case of this write-in operation, an "asteroid curve" indicating the relation between the direction of an applied magnetic field and a reversal magnetic field is taken into consideration.

On the other hand, read out is performed by flowing a sense current through the ferromagnetic tunnel junction, and by detecting a resistance change by TMR effect. A number of such memory elements are aligned to form a large-capacity memory device.

Its actual configuration is made up by placing a switching transistor for each cell and combining peripheral circuits similarly to DRAM (dynamic random access memory), for example. There is also a proposal of a system incorporating ferromagnetic tunnel junctions in combination with diodes at crossing positions of word lines and bit lines (U.S. Pat. No. 5,640,343 and U.S. Pat. No. 5,650,958).

For higher integration of magnetic memory elements using ferromagnetic tunnel junctions as memory cells, the size of each memory cell becomes smaller, and the size of the ferromagnetic element forming the cell inevitably becomes smaller. There is the same situation in magnetic recording systems when the recording density is enhanced and the recording bit size is decreased.

In general, as the ferromagnetic element becomes smaller, its coercive force increases. Since the intensity of the coercive force gives criteria for judging the magnitude of the switching magnetic field required for reversal of magnetization, its increase directly means an increase of the switching magnetic field. Therefore, upon writing bit information, a larger current must be supplied to the write line, and it invites undesirable results such as an increase of power consumption, shortening the wiring lifetime, etc. Therefore, it is an important issue for practical application of high-integrated magnetic memory to reduce the coercive force of the ferromagnetic element used as the memory cell of magnetic memory.

In order to solve this problem, a magnetic memory element equipped with a thin film which becomes the circumference of write-in wiring from material which has a high magnetic permeability is proposed (the U.S. Pat. No. 5,659,499, the U.S. Pat. No. 5,956,267, the U.S. Pat. No. 5,940,319, and international patent application WO 00/10172).

In these elements, a magnetic flux generated by write-in current can be converged by thin film which has a high magnetic permeability in the circumference of write-in wiring. Therefore, a magnetic field generated at the time of writing can be strengthened, and bit information can be written in with smaller current as the result. At the same time, since a magnetic flux which leaks to the exterior of a high magnetic-permeability thin film can be reduced greatly, an effect which can reduce cross talk is also acquired.

However, in the case of the structure currently disclosed in the U.S. Pat. No. 5,659,499, a magnetic field cannot be uniformly applied over the magnetic whole record layer.

Moreover, in the case of the structure disclosed in the U.S. Pat. No. 5,956,267 and the U.S. Pat. No. 5,940,319, a magnetic field cannot be applied efficiently to the magnetic record layer, since a distance between the high magnetic-permeability thin film and the magnetic record layer is large and especially the distance becomes too large in the case where two or more magnetization pinned layers are provided in order to obtain a higher output.

On the other hand, in the case of structure disclosed in the international patent application WO 00/10172, it has structure where distance between the high magnetic-permeability thin film and the magnetic record layer becomes small, however, it is difficult to concentrate sufficient magnetic flux to the magnetic record layer.

Moreover, in any of these disclosures, it is not devised at all about a cross sectional shape of the write-in wiring.

SUMMARY OF THE INVENITON

This invention is made based on recognition of this subject, and by applying a magnetic field to a magnetic record layer efficiently by write-in smaller current, the purpose is the degree of high accumulation, and is to reduce power consumption and offer a reliable magnetic memory element.

According to an embodiment of the invention, there is provided a magnetic memory comprising:

a magnetoresistance effect element having a magnetic recording layer;

a first writing wiring extending in a first direction on or below the magnetoresistance effect element, a center of gravity of an axial cross section of the wiring being apart from a center of thickness at the center of gravity, and the center of gravity being eccentric toward the magnetoresistance effect element; and a writing circuit configured to pass a current through the first writing wiring in order to record an information in the magnetic recording layer by a magnetic field generated by the current.

According to another embodiment of the invention, there is provided a magnetic memory comprising:

a magnetoresistance effect element having a magnetic recording layer;

a first writing wiring extending in a first direction on or below the magnetoresistance effect element, an axial cross section of the wiring being formed into a shape which is asymmetric in a vertical direction and a width of the shape being broader toward the magnetoresistance effect element; and a writing circuit configured to pass a current through the first writing wiring in order to record an information in the magnetic recording layer by a magnetic field generated by the current.

According to yet another embodiment of the invention, there is provided a magnetic memory comprising:

a magnetoresistance effect element having a magnetic recording layer;

a first writing wiring extending in a first direction below the magnetoresistance effect element, a center of gravity of an axial cross section of the first writing wiring being apart from a center of thickness at the center of gravity, and the center of gravity being eccentric toward the magnetoresistance effect element;

a second writing wiring extending in a second direction to intersect the first direction on the magnetoresistance effect element, a center of gravity of an axial cross section of the second writing wiring being apart from a center of thickness at the center of gravity, and the center of gravity being eccentric toward the magnetoresistance effect element; and a writing circuit configured to pass currents through the first and second writing wirings in order to record an information in the magnetic recording layer by magnetic fields generated by the currents.

According to yet another embodiment of the invention, there is provided a magnetic memory comprising:

a magnetoresistance effect element having a magnetic recording layer;

a first writing wiring extending in a first direction below the magnetoresistance effect element, an axial cross section of the first writing wiring being formed into a shape which is asymmetric in a vertical direction and a width of the shape being broader toward the magnetoresistance effect element;

a second writing wiring extending in a second direction to intersect the first direction on the magnetoresistance effect element, an axial cross section of the second writing wiring being formed into a shape which is asymmetric in a vertical direction and a width of the shape being broader toward the magnetoresistance effect element; and a writing circuit configured to pass currents through the first and second writing wirings in order to record an information in the magnetic recording layer by magnetic fields generated by the currents.

According to yet another embodiment of the invention, there is provided a magnetic memory comprising:

a magnetoresistance effect element having a magnetic recording layer;

a first writing wiring extending in a first direction below the magnetoresistance effect element, a second writing wiring extending in a second direction to intersect the first direction on the magnetoresistance effect element,; and a writing circuit configured to pass currents through the first and second writing wirings in order to record an information in the magnetic recording layer by magnetic fields generated by the currents, a shape of an axial cross section of the first writing wiring being different from a shape of an axial cross section of the second writing wiring, the shapes of the axial cross sections of the first and second writing wirings are rectangular or trapezoidal, one of the first and second writing wirings being remoter from the magnetoresistance effect element, and and the remoter wiring having a larger ratio of a length of one side which is closer to the magnetoresistance element to a length of another side which is remoter from the magnetoresistance effect element than another of the first and second writing wirings.

As explained in full detail above, according to the embodiment, a magnetic field can be efficiently applied to the magnetic record layer of the magnetoresistance effect element by giving form peculiar to the axial cross section of the wiring for writing of a magnetic memory.

Write-in current required as the result, in order to record bit information can be reduced greatly, and a magnetic memory with little power consumption can be offered.

Thus, according to the embodiment, the magnetic memory of the degree of high integration can be realized with low power consumption, and the merit on industry is great.

BRIEF DESCRIPTION OF THE DRAWINGS

The present invention will be understood more fully from the detailed description given herebelow and from the accompanying drawings of the embodiments of the invention. However, the drawings are not intended to imply limitation of the invention to a specific embodiment, but are for explanation and understanding only.

In the drawings.

DETAILED DESCRIPTION

Some embodiments of the invention will now be explained below with reference to the drawings.

Figure 1A:
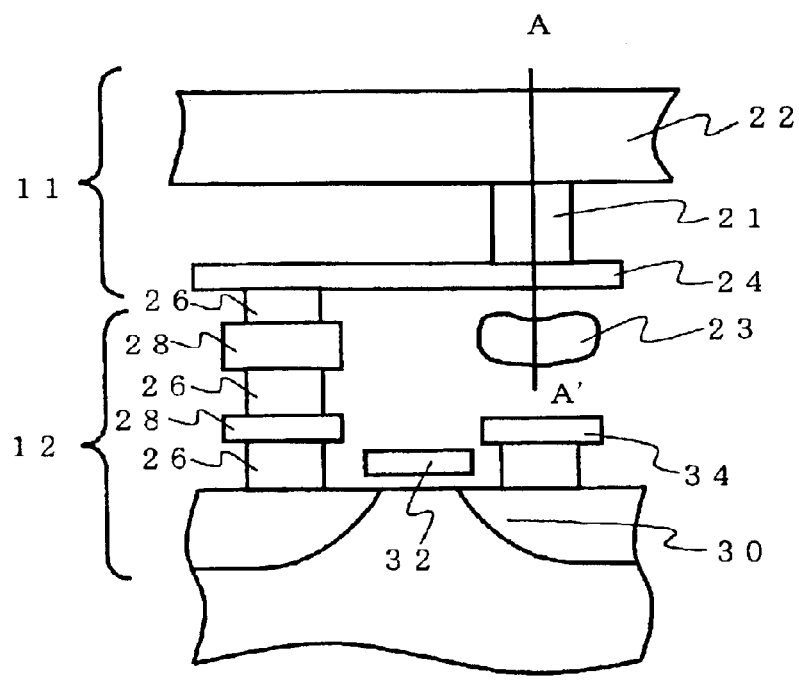
FIG. 1A is a conceptual diagram showing a principal part of the cross sectional structure of a magnetic memory according to an embodiment of the invention.

FIG. 1A is a conceptual diagram showing a principal part of the cross sectional structure of a magnetic memory according to an embodiment of the invention.

Figure 1B:
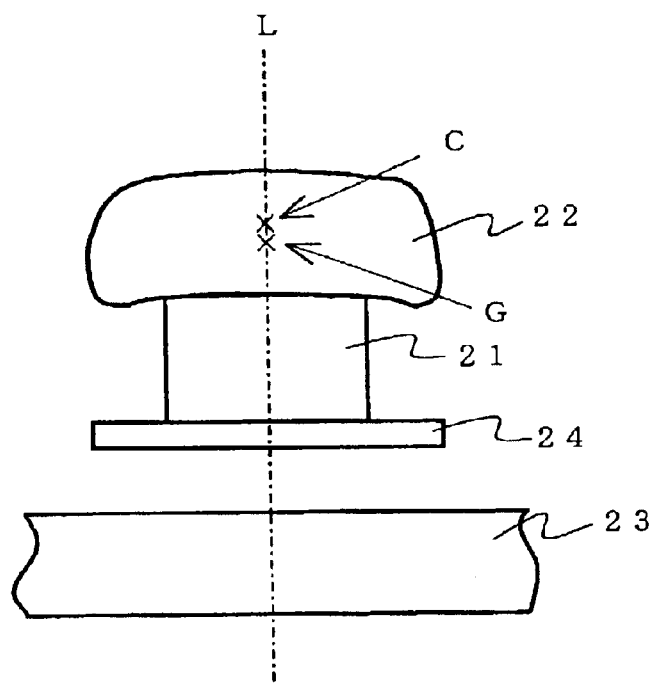
FIG. 1B shows the A–A' line sectional view.

And FIG. 1B shows the A–A' line sectional view.

That is, the structure shown in these figures corresponds to the memory cell of the 1-bit portion of the magnetic memory which operates as a random access memory.

This memory cell consists of a storage cell portion 11 and a transistor portion 12 for address selection. The storage cell portion 11 has the magnetoresistance effect element 21 and a pair of wiring 22 and 24 connected to the element 21. The magnetoresistance effect element 21 has the laminating structure of for example, a magnetic layer/non-magnetic layer/magnetic layer, or a magnetic layer/insulated tunnel layer/magnetic layer, and may have the GMR effect, the TMR effect, etc.

What is necessary is to pass sense current for the magnetoresistance effect element 21 in the case of bit information read-out, and just to detect the resistance change, in the case where the element 21 has the GMR effect.

If the element 21 has a ferromagnetic double tunnel junction structure such as magnetic layer/non-magnetic tunnel layer/magnetic layer/non-magnetic tunnel layer/magnetic layer etc., it is advantageous at a point that the high magnetoresistance effect is acquired by a large resistance change by the tunnel magnetoresistance (TMR) effect.

In such structures, one of magnetic layers shall act as a magnetization pinned layer, and one of other magnetic layers shall act as a magnetic record layer.

As for a magnetization pinned layer and a magnetic record layer, it is desirable to include a ferromagnetic substance layer which consists of an alloy containing iron (Fe), cobalt (Co), nickel (nickel), or one of these etc., or to include half-metallic magnetic layers, such as nickel manganese antimony (NiMnSb), platinum manganese antimony (PtMnSb), and cobalt manganese germanium ($Co_2MnGe$).

As for the magnetization pinned layer, the thickness of these magnetic layers may be increased in order to obtain a higher coercive force.

Or magnetization can be pinned by exchange interaction which works between a magnetic layer and an anti-ferromagnetic layer by employing a structure where the laminating of the anti-ferromagnetic layer was carried out to a magnetization pinned layer.

On the other hand, a transistor 30 connected through a via 26 and buried wiring 28 is formed in a transistor portion 12 for selection. This transistor 30 carries out switching operation according to the voltage applied to a gate 32, and controls switching of the current path between the magnetoresistance effect element 21 and wiring 34.

Moreover, under the magnetoresistance effect element, the write-in wiring 23 is formed in the direction which intersects the wiring 22. These write-in wirings 22 and 23 can be formed with the alloy containing aluminum (aluminum), copper (Cu), tungsten (W), tantalum (Ta), or one of these.

In a memory cell of such structure, when writing bit information in the magnetoresistance effect element 21, a write-in pulse current is passed to the wirings 22 and 23. Then, a synthetic magnetic field induced by these current is applied to a record layer, and magnetization of a record layer of the magnetoresistance effect element can be reversed suitably.

On the other hand, when reading bit information, sense current is passed through wiring 22, the magnetoresistance element 21 containing a magnetic-recording layer, and the lower electrode 24, and a change of the resistance of the magnetoresistance effect element 21 or resistance itself is measured.

In this embodiment, the axial cross sectional shape of wiring 22 and 23 is asymmetrical in the vertical direction. And when taken along with the central line of the magnetoresistance effect element 21, the center of gravity of the cross section of these wiring is in the position offset from the center of the thickness direction of the wiring toward the magnetoresistance effect element 21.

For example, with reference to FIG. 1B, when taken along with the central line L of the magnetoresistance effect element 21, the center of gravity G of the axial cross section is in the position is off-centered towards the magnetoresistance effect element 21 from the central point C in the thickness direction of wiring 22.

In order to make the eccentricity of the center of gravity G in the direction of the magnetoresistance effect element 21, what is necessary is just to give the cross section where the width of the section of the write-in wiring 22 and 23 becomes broader towards the magnetoresistance effect element 21, for example, as shown in FIG. 1B.

Figure 2A:
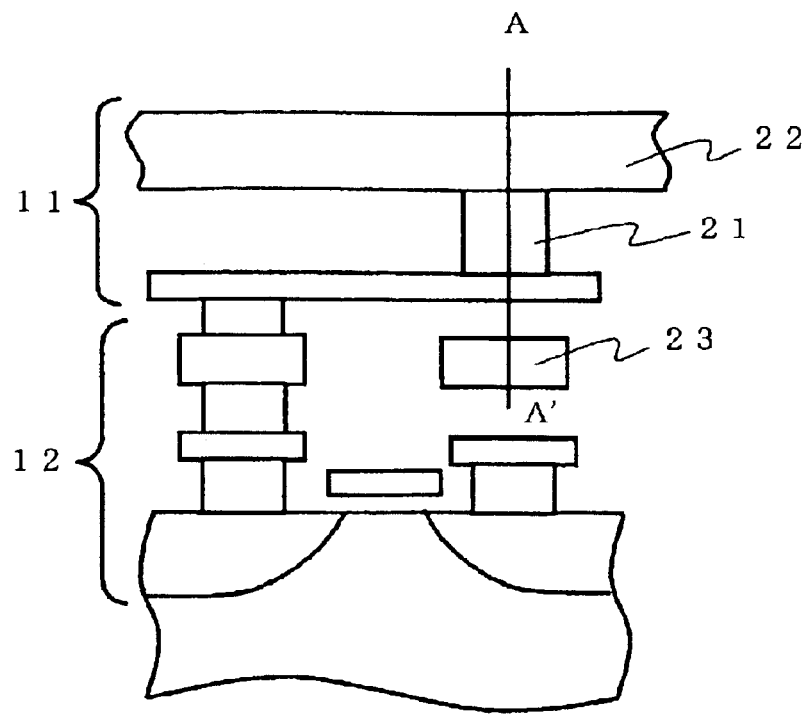
FIGS. 2A and 2B are conceptual diagrams showing the memory cell of the magnetic memory as an example of comparison.
Figure 2B:
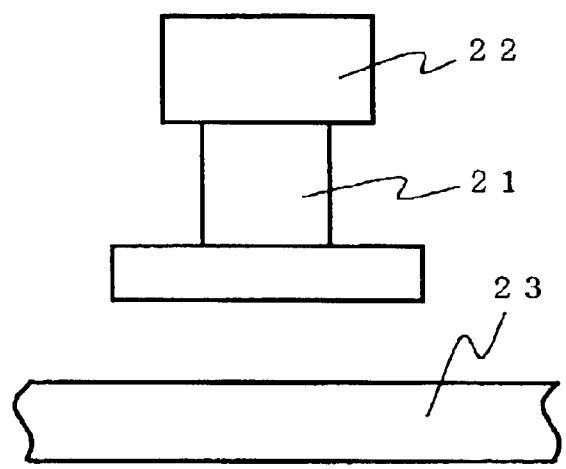

FIGS. 2A and 2B are conceptual diagrams showing the memory cell of the magnetic memory as an example of comparison. With regard to FIGS. 2A and 2B, the same symbol is given to the similar element as what was mentioned above with regard to FIGS. 1A and 1B, and detailed explanation is omitted.

In the case of this example of comparison, the axial cross section of wirings 22 and 23 has the shape of a substantially rectangle symmetrical in a vertical direction. And the center of gravity G of the cross section of the wirings is in the same position as the center C of the thickness direction taken along with the central line L of the magnetoresistance effect element 21.

Now, the strength of the magnetic field generated when current is passed to the wirings 22 and 23 having a cross section as shown in FIGS. 1A and 1B or 2A and 2B is obtained by the Biot-Savart law. According to the law, supposing current density is fixed on each point in a wiring section, the magnetic field generated in the point X which only a certain distance separated from wiring will be described by superposition of the magnetic field generated with the current density of each point in the section of the wiring.

Since the magnetic field generated with the current density of each point in the section of wiring is in inverse proportion to the distance from the point to Point X, a generating magnetic field becomes larger as the distance becomes smaller.

On the other hand, it is difficult to arrange the wiring and the magnetic record layer closer than a certain distance because of the structural problem of an actual memory cell. Therefore, it is more advantageous to form the cross section of write-in wiring asymmetrically as shown in FIGS. 1A and 1B rather than symmetrical in a vertical direction. And by setting the position of center of gravity of the cross section of write-in wiring eccentric toward the magnetoresistance effect element rather than the central point in the thickness direction, the magnetic field applied to the magnetoresistance effect element from write-in wiring will becomes stronger.

Therefore, the cross sectional shape of write-in wiring is formed as shown in FIGS. 1A and 1B, the magnetic field applied to the magnetoresistance effect element 21 from the write-in wirings 22 and 23 becomes strong, and a magnetic field can be efficiently applied to a magnetic-recording layer.

This point will be explained more quantitatively, referring to some examples.

According to the embodiment, the power consumption of a magnetic memory can be reduced by giving the feature peculiar to the cross sectional shape of write-in wiring in this way.

Moreover, the stable writing is attained, even if the magnetoresistance effect element 21 is miniaturized to increase the degree of integration of magnetic memory and thereby increasing the coercive force of the recording layer.

Furthermore, by reducing the write-in current passed to the write-in wirings 22 and 23, the electro-migration in the wirings can be reduced, the reliability of magnetic memory can be improved, and a life can also be prolonged.

Next, the fabrication method of the asymmetrical wirings 22 and 23 which has the cross section as shown in FIGS. 1A and 1B is explained.

Figure 3A:
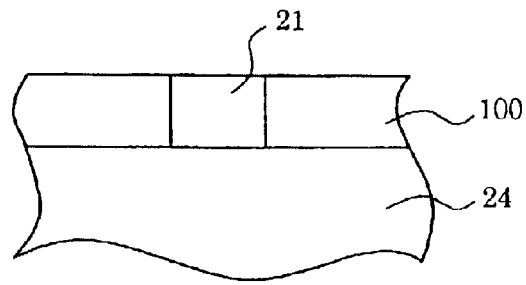
FIGS. 3A through 3D are schematic cross sectional diagrams showing the process of the fabrication method of wirings 22 and 23.
Figure 3B:
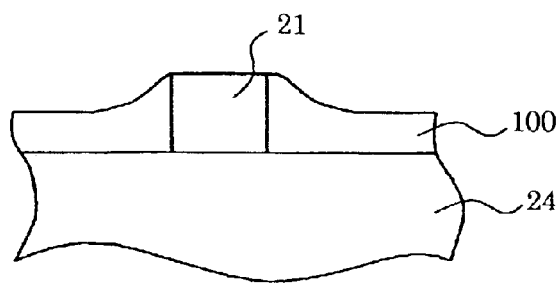

FIGS. 3A through 3D are schematic cross sectional diagrams showing the process of the fabrication method of wirings 22 and 23. That is, first, as shown in FIG. 3A, the magnetoresistance effect element 21 is formed on the lower wiring 24, then the insulating layer 100 is formed at the circumference of the element 21. Next, as shown in FIG. 3B, the surface is polished and a distribution that the thickness of the insulating layer 100 becomes gradually thinner in the circumference of the magnetoresistance effect element 21 is provided.

Figure 3C:
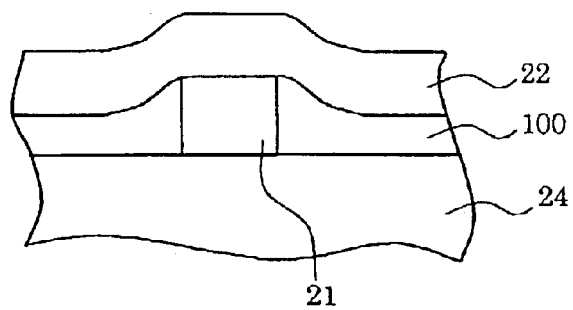

Such an etching distribution can be realized by choosing an appropriate etchant or by adjusting a buff pressure, etc. in chemical mechanical polishing, for example. After that, as shown in FIG. 3C, the material of wiring 22 is deposited on the surface.

Figure 3D:
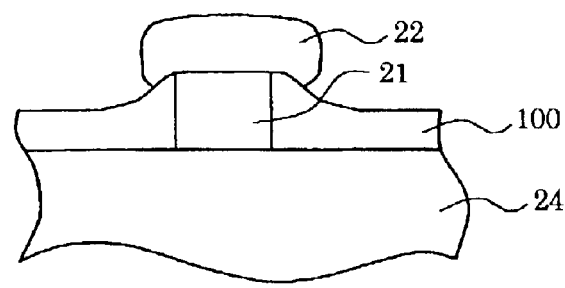

Then, the wiring having the shape as shown in FIG. 3D is acquired by carrying out a patterning process. On this occasion, first, a vertical patterning is performed by an anisotropic etching process, then the corners of the wiring 22 are rounded by a wet etching or an isotropic gaseous phase etching Alternatively, after preparing a mask which is not illustrated, pattering process may be performed by using a wet etching or an isotropic gaseous phase etching from the beginning in order to fabricate the rounded wiring 22 as shown in FIG. 3D. The peculiar cross section shape shown in FIGS. 1A and 1B can be realized with the process which was explained above.

It is not necessary to give such a peculiar asymmetrical cross section as shown in FIGS. 1A and 1B for the wirings which does not pass write-in current. For example, since the lower wiring 24 is used only for read-out in the case of the example of FIGS. 1A and 1B, it is also good to employ a usual symmetrical cross section without giving the asymmetrical cross section like wiring 22 and 23. Thus, the formation process of wiring 24 becomes simplified.

Next, the example of transformation of the embodiment is explained.

FIGS. 4A through 5B are conceptual diagrams which show the examples of the embodiment. The same symbol is given to the similar element as what was mentioned above about FIGS. 1A and 1B with regard to these drawings, and detailed explanation is omitted.

Figure 4A:
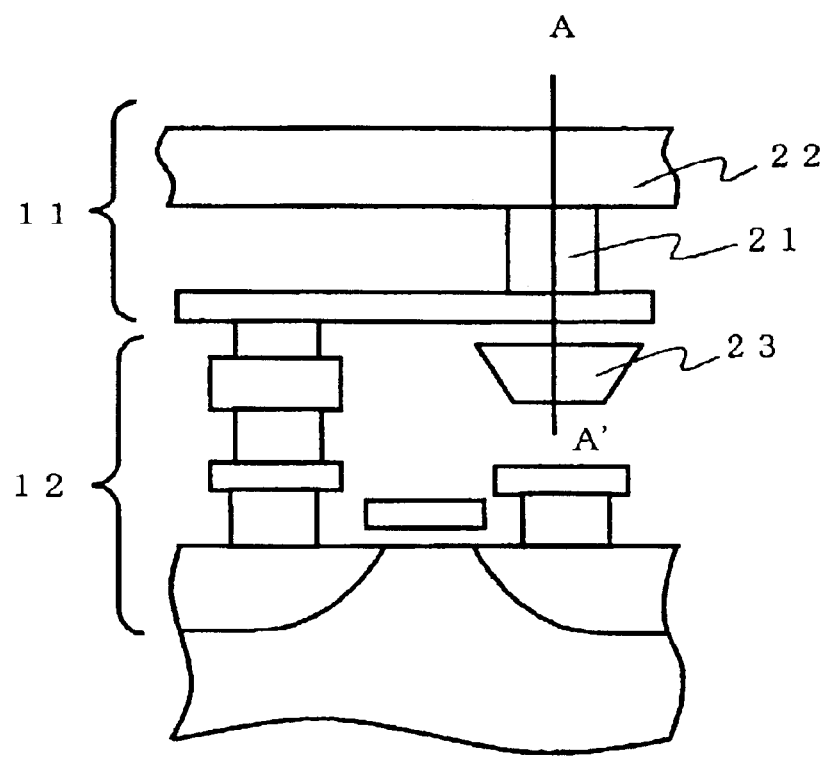
FIGS. 4A through 5B are conceptual diagrams which show the examples of the embodiment.
Figure 4B:
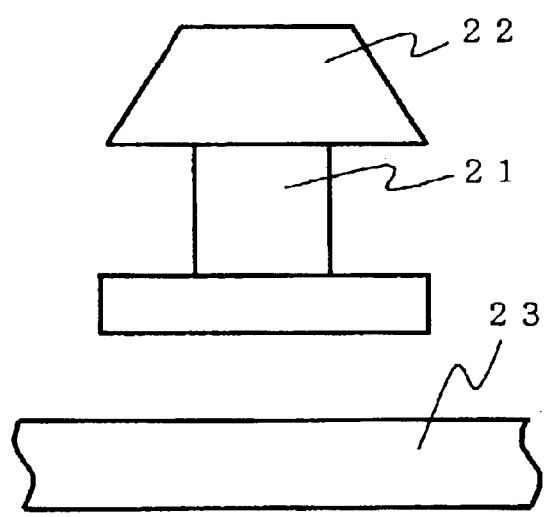

In the case of the memory cell shown in FIGS. 4A and 4B, cross section of the write-in wirings 22 and 23 is made into the shape of a trapezoid where the longer side is closer to the magnetoresistance effect element 21. Here, instead of the trapezoidal shape, the axial cross section may be formed into a substantially triangle. That is, such a triangle can be obtained by making the length of the shorter side of the trapezoid almost zero. This point will be explained in greater detail later on, with reference to a second example of the invention.

Figure 5A:
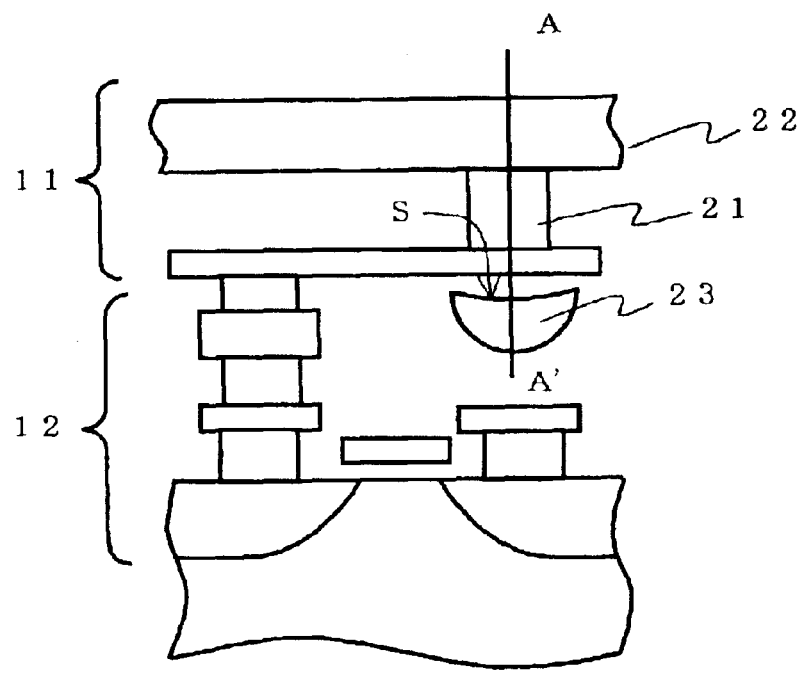
Figure 5B:
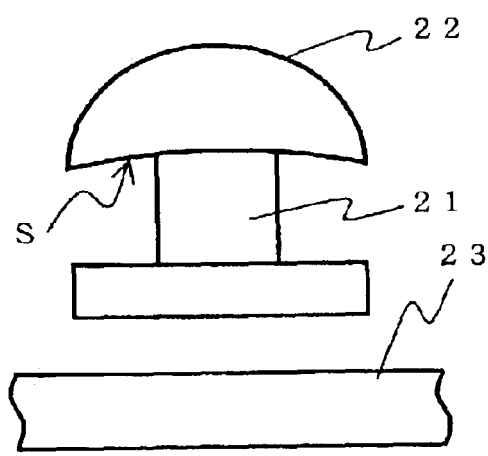

In the case of the memory cell shown in FIGS. 5A and 5B, the cross section of the write-in wirings 22 and 23 is semicircle-like, and is made into form from which the arc part is apart from the magnetoresistance effect element 21.

Furthermore, the side S which countered the magnetoresistance effect element 21 of the cross section of these wirings 22 and 23 is curving to the concave when taken from the magnetoresistance effect element 21.

Also in the memory cells shown in these FIGS. 4A through 5B, the cross section of the wirings 22 and 23 is asymmetrical in a vertical direction, and the center of gravity of the cross section is eccentric toward the magnetoresistance effect element 21 taken along the central line of the magnetoresistance effect element 21.

By forming the write-in wirings 22 and 23 which have such peculiar section form, the magnetic field applied to the magnetoresistance effect element 21 becomes stronger, and a magnetic field can be efficiently applied to a magnetic record layer.

A method to fabricate the shape of a trapezoid and reverse trapezoid cross sections as shown in FIGS. 4A and 4B will be explained next.

Figure 6A:
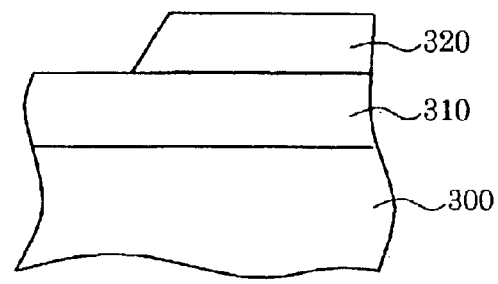
FIGS. 6A through 6D are schematic diagrams showing a process to fabricate a wiring having a trapezoid cross section.

FIGS. 6A through 6D are schematic diagrams showing a process to fabricate a wiring having a trapezoid cross section. First, as shown in FIG. 6A, the layer 310 which should be made into the wiring is formed on a base layer 300, and the mask 320 which covers a part is further formed on it.

Figure 6B:
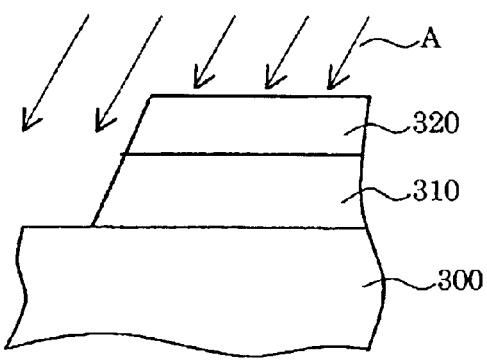

Next, as shown in FIG. 6B, anisotropic etching A is performed with an inclined incident angle. Specifically, an ion milling or other etching methods, such as RIE (Reactive Ion Etching), can be used. Then, the portion on which the masking is not carried out is etched away, and a slope is formed in a boundary with the mask part.

Figure 6C:
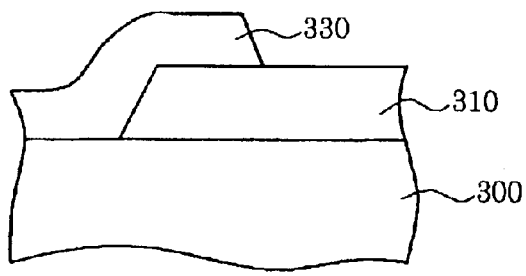
Figure 6D:
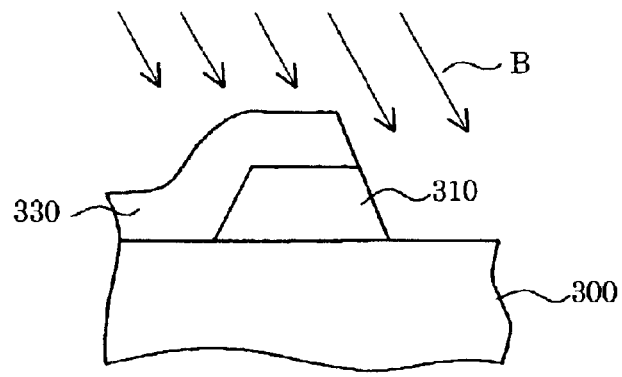

Next, a mask 330 is formed in an opposite side as shown in FIG. 6C. Then, as shown in FIG. 6D, an anisotropic etching B is performed from the opposite direction with an inclined incident angle. Then, the portion on which the masking is not carried out is also etched away, and a slope is also formed in the boundary with the mask part. Thus, the wiring having a trapezoid cross section is fabricated by combining the anisotropic etching with a slant etching angle. A wiring which has a reverse trapezoid cross section can also be formed by forming an opening having a reverse trapezoid cross section by the same process as explained above, then by burying the object material which forms the wiring in the opening.

Next, a method to fabricate the wiring having the circular cross section as shown in FIGS. 5A and 5B will be explained.

FIGS. 7A through 7D are schematic diagrams showing a process to fabricate a wiring having a circular cross section.

Figure 7A:
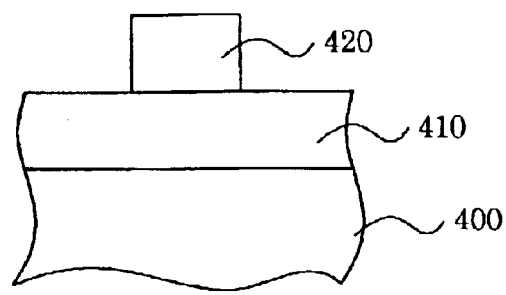
FIGS. 7A through 7D are schematic diagrams showing a process to fabricate a wiring having a circular cross section.

First, as shown in FIG. 7A, the layer 410 which should be made into the wiring is formed on a base layer 400, and the mask 420 which covers a part is further formed on it. As this mask, the deformable material is desirable. For example, a resist or polyimide can be used.

Figure 7B:
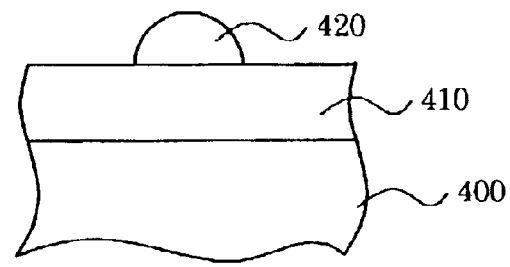

Next, as shown in FIG. 7B, a mask 420 is softened and it rounds circularly with a surface tension. Generally such a softening process is possible by heating an organic material such as a predetermined resist or others.

Figure 7C:
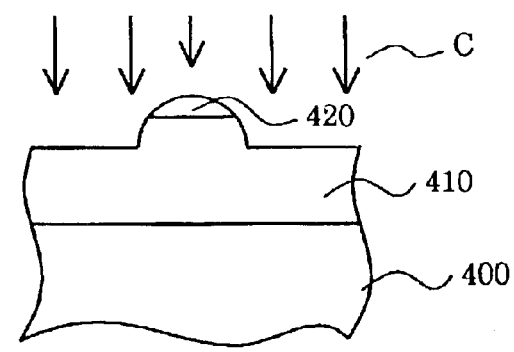

Next, as shown in FIG. 7C, anisotropic etching C is given from a substantially perpendicular direction. As this etching method, an ion milling and the etching methods, such as RIE (Reactive Ion Etching), can be used. Then, etching removal of the layer 410 exposed to a mask 420 and its circumference is carried out simultaneously, and etching advances.

Figure 7D:
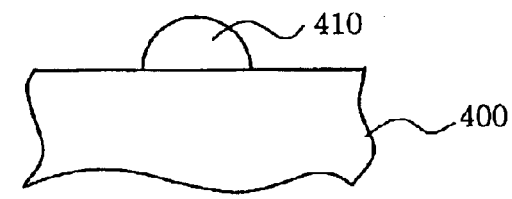

The form of a mask 420 is transferred to the layer 410 as the result. And if etching is advanced further, as shown in FIG. 7D, etching removal of the mask 420 will be carried out completely, and the layer 410 to which the shape of a mask 420 was transferred will be formed. Thus, wiring having a circular cross section can be fabricated.

Strictly speaking, in the case of this formation process, the cross sectional shape of a mask 420 may differ from the cross sectional shape of the transferred layer 410 according to a difference of the etching speed of a mask 420 and a layer 410. However, it is easy to adjust the mask form where the effect of a difference of such an etching selection ratio was taken into consideration, then desired section form can be realized.

Figure 8A:
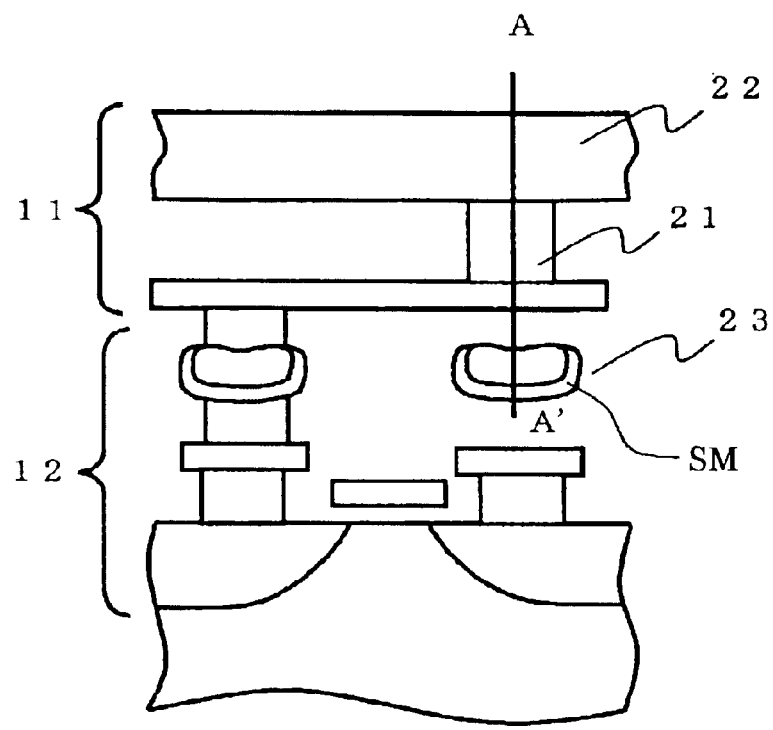
FIGS. 8A and 8B are conceptual diagrams showing another example of the embodiment.
Figure 8B:
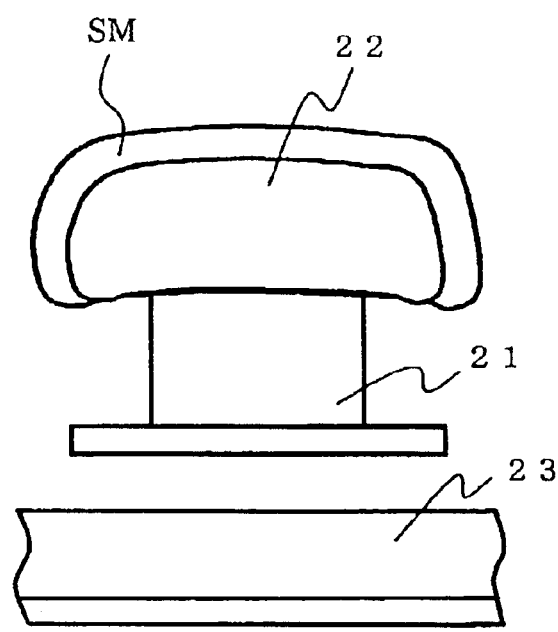
Figure 9A:
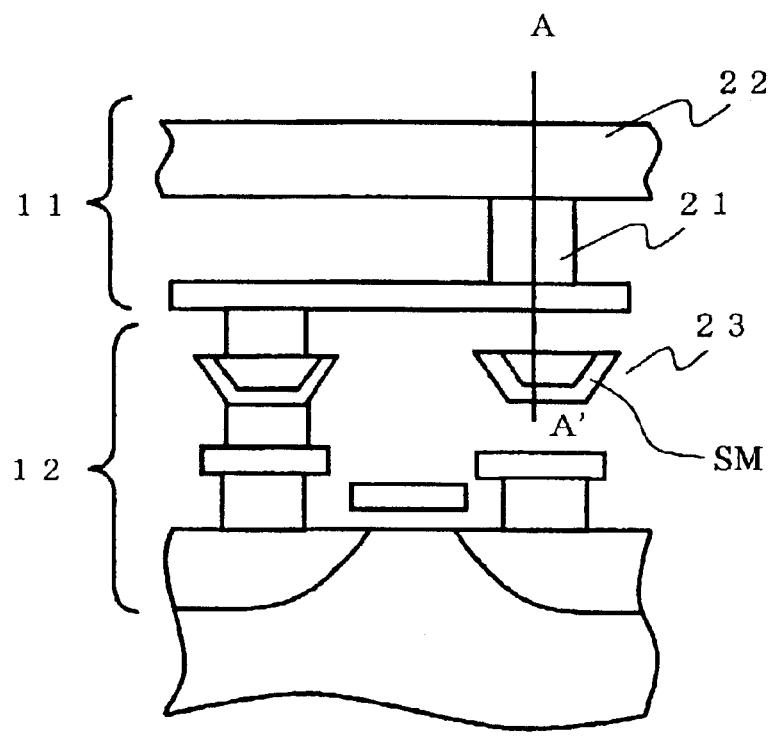
FIGS. 9A through 10B are conceptual diagrams showing the further examples of the embodiment.
Figure 9B:
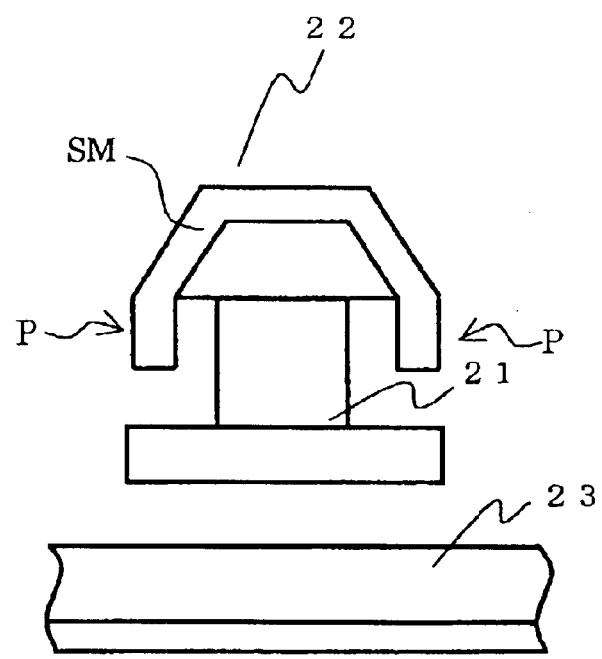

FIGS. 8A and 8B are conceptual diagrams showing another example of the embodiment. The same symbol is given to the similar element as what was mentioned above about FIGS. 1A through 7D with regard to FIGS. 8A and 8B, and detailed explanation is omitted.

In this example, the covering layer SM made of a magnetic material and which becomes the circumference of the write-in wirings 22 and 23 is added. That is, the covering layer SM is formed around the wirings 22 and 23 so that the surface which does not counter the magnetoresistance effect element 21 may be covered. By forming the covering layer SM, the leakage to the circumference of the current magnetic field generated from the write-in wirings 22 and 23 can be prevented, and "the write-in cross talk" to the magnetoresistance effect element of other adjoining memory cells can be prevented.

Furthermore, when this covering layer SM acts as the so-called "magnetic yoke", as exemplified in FIGS. 8A and 8B, the magnetic field M can be concentrated to the magnetoresistance effect element 21 and the writing efficiency can be further improved. In order to obtain such a function, as a material of the covering layer SM, it is desirable to use a material having a high magnetic-permeability.

It is especially desirable to use a material having a relative permeability not lower than five, and a material having a relative permeability not lower 100 is more desirable. Moreover, the one where saturation magnetization is larger is desirable, it is desirable that it is 500 or more, and it is more desirable that it is 1000 or more.

As such a material, iron (Fe), an iron aluminum (Fe-aluminum) alloy, an iron silicon (Fe—Si) alloy, and iron silicon aluminum (Fe—Si-aluminum) alloys such as a sendust can be used.

Alternatively, as the material of the covering layer SM, the soft ferrite which includes a nickel iron (NiFe) alloy or iron oxide ($Fe_2O_3$) as its main component can be used.

Further, as the material of the covering layer SM, various kinds of high magnetic-permeability material, such as an amorphous alloy having any one of iron (Fe), cobalt (Co) and nickel (nickel), and any one of (Boron B), silicon (Si), phosphorous (P) etc., can also be used.

FIGS. 9A through 10B are conceptual diagrams showing the further example of the embodiment. That is, in the case of the memory cell shown in FIG. 9, cross sectional shape of the write-in wirings 22 and 23 is made to be the same as that of what was shown in FIGS. 4A and 4B.

Moreover, the similar covering layer SM as what was mentioned above with reference to FIGS. 8A and 8B is formed. By forming such a covering layer SM, as mentioned above about FIG. 8, leakage of the write-in magnetic field to an adjoining memory cell can be prevented, and the generating magnetic field to the magnetoresistance effect element 21 can be strengthened.

Furthermore, in the case of this example, the covering layer SM added to the circumference of the write-in wiring 22 has the projecting part P projected toward the magnetoresistance effect element 21. By forming such a projecting part P, it becomes possible to concentrate still more efficiently the write-in magnetic field emitted from the covering layer SM on the record layer of the magnetoresistance effect element 21.

Moreover, it cannot be overemphasized that the similar projecting part P may be formed to the lower write-in wiring 23. Furthermore, in the portion near the magnetoresistance effect element 21, in order to strengthen a generating magnetic field, the covering layer SM added to the circumference of wiring 22 and 23 can be formed so that the thickness may become thinner toward a magnetic-recording layer. If it does in this way, a write-in magnetic field can be concentrated on a record layer still more efficiently.

Furthermore, the projecting part P of the covering layer SM can be crooked from the middle of the projecting part taken out from the portion of the origin which adjoined wiring 22, or wiring 22 a total, and it can also be provided so that it may carry out toward the magnetic-recording layer of the magnetoresistance effect element 21. If it does in this way, the tip of the projecting part P of the covering layer SM can be brought further close to a magnetic-recording layer, and it is possible to concentrate a write-in magnetic field on a record layer still more efficiently.

Figure 10A:
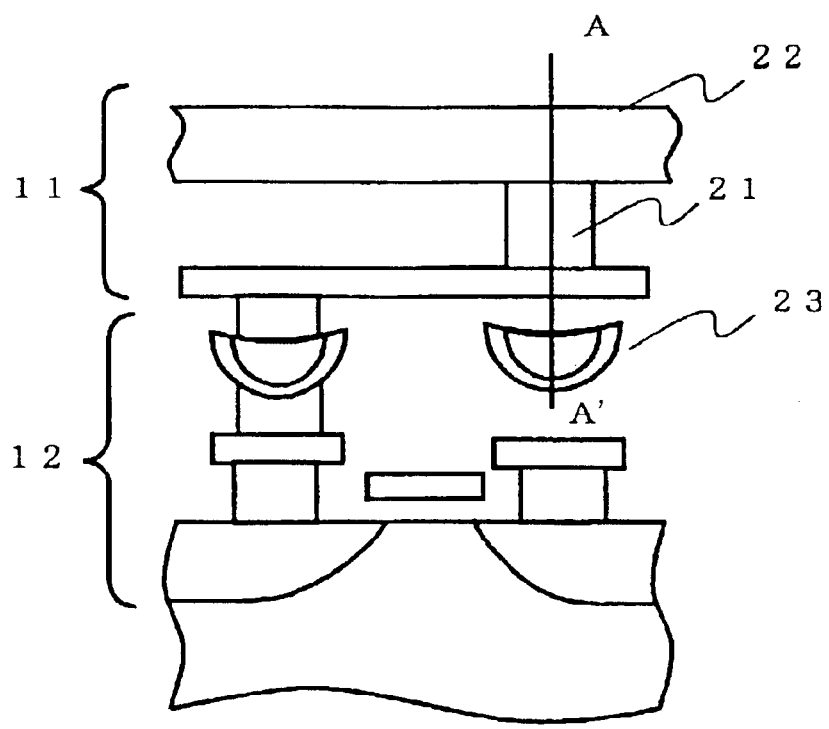
Figure 10B:
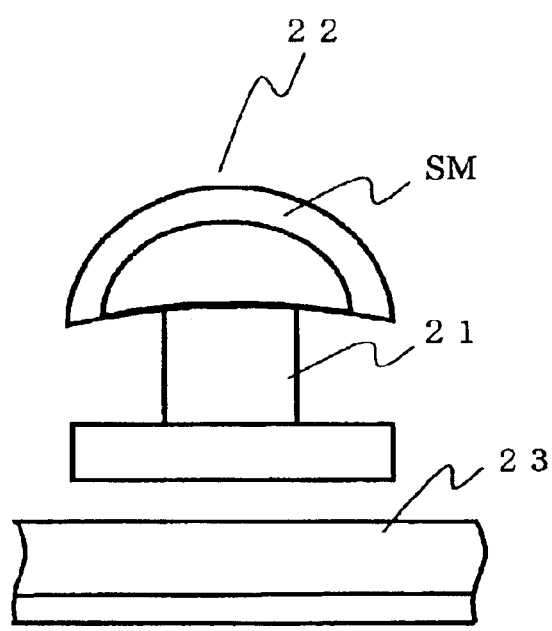

In the case of the memory cell shown in FIG. 10, cross sectional shape of the write-in wirings 22 and 23 is made to be the same as that of what was shown in FIGS. 5A and 5B. Furthermore, the similar covering layer SM as what was mentioned above about FIGS. 8A is formed.

Also in this example, by forming such a covering layer SM, leakage of the write-in magnetic field to an adjoining memory cell can be prevented, and the generating magnetic field to the magnetoresistance effect element 21 can be strengthened. Moreover, also in this example, a write-in magnetic field can be concentrated on a record layer still more efficiently by forming the projecting part P which was exemplified in FIGS. 9A and 9B.

Magnetic memory can be formed by arranging a memory cell which was explained above in the shape of a matrix.

Figure 11:
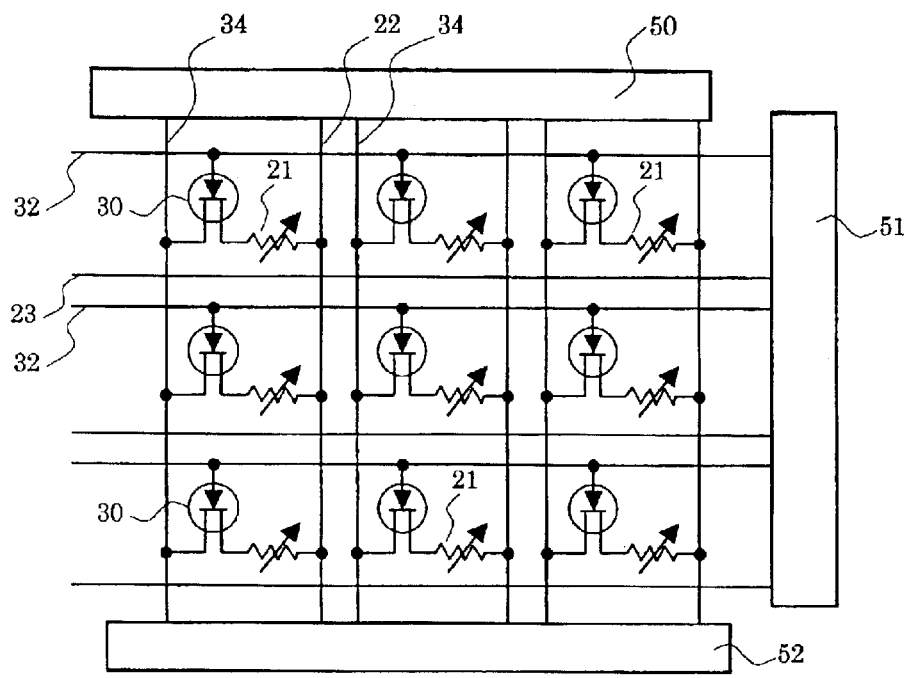
FIG. 11 is a conceptual diagram which exemplifies the matrix structure of the magnetic memory of the embodiment.

FIG. 11 is a conceptual diagram which exemplifies the matrix structure of the magnetic memory of the embodiment. That is, this figure shows the circuit structure of the embodiment in the case of having arranged the memory cell mentioned above with reference to FIGS. 1A through 10B in the shape of a matrix array.

In order to choose 1 bit in an array, it has the sequence decoder 50 and the line decoder 51. By selecting the bit line 34 and the word line 32, specific switching transistor 30 is turned on and a specific cell is chosen uniquely. And the bit information recorded on the magnetic-recording layer which constitutes the magnetoresistance effect element 21 can be read by detecting with a sense amplifier 52.

When writing in bit information, writing current is passed in the specific write-in word line 23 and the specific bit line 22, respectively, and the current magnetic field is applied to the recording layer of a specific cell. In this structure, since the cross sectional shape of the bit lines 22 and the word lines 23 has peculiar shape as exemplified in any of FIGS. 1A through 7B, writing is performed efficiently to the magnetic-recording layer of the magnetoresistance effect element 21.

Figure 12:
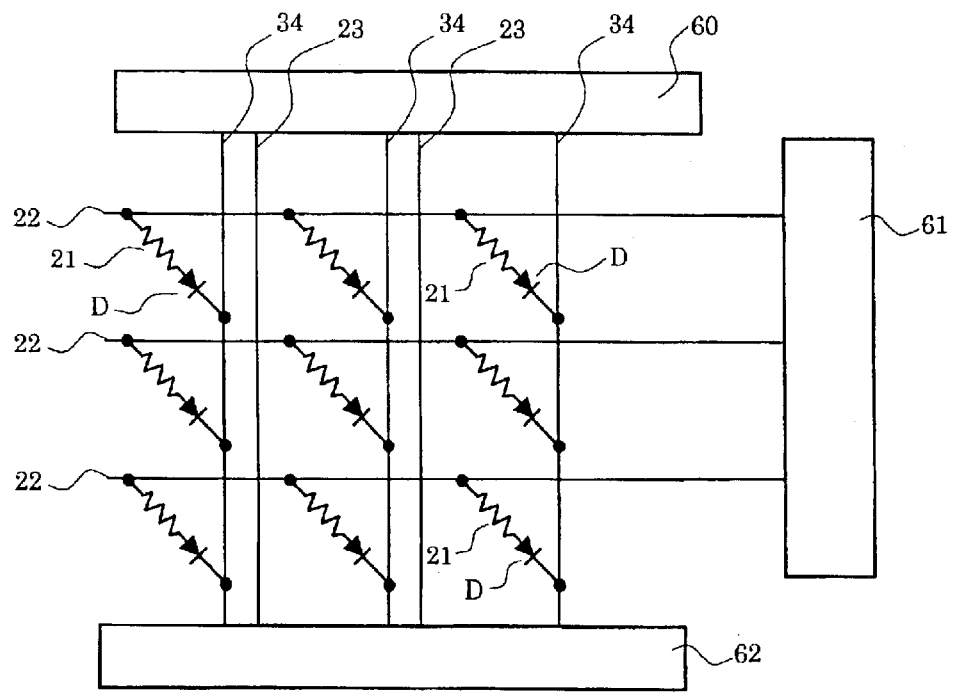
FIG. 12 is a conceptual diagram showing another example of the matrix structure of the magnetic memory of the embodiment.

FIG. 12 is a conceptual diagram showing another example of the matrix structure of the magnetic memory of the embodiment. That is, in the case of this example, the bit lines 22 and word lines 34 which were wired in the shape of a matrix are chosen by decoders 60 and 61, respectively, and the specific memory cell in an array is chosen uniquely.

Each memory cell has the structure where Diode D is connected with the magnetoresistance effect element 21 in series. Here, Diode D has the role to prevent that sense current detours in memory cells other than magnetoresistance effect element 21 selected.

In writing, write-in current is passed in a specific bit line 22 and a word line 23, thereby applying the current magnetic field to the recording layer of a specific cell. Also in this matrix structure, since the cross sectional shape of the bit lines 22 and word lines 23 has peculiar shape as exemplified in any of FIGS. 1A through 7B, the writing to the magnetic-recording layer of the magnetoresistance effect element 21 can be performed efficiently.

EXAMPLE

Embodiments of the invention will be explained below in greater detail with reference to Examples. That is, here explains the result of having investigated quantitatively the magnetic field which the wiring generates, giving an example about the cross sectional shape of the write-in wirings 22 and 23 of the magnetic memory of this invention with some comparative samples.

First Example

First, as shown in FIGS. 2A and 2B, the case where the cross section of wirings 22 and 23 is a rectangle-like is explained.

Figure 13:
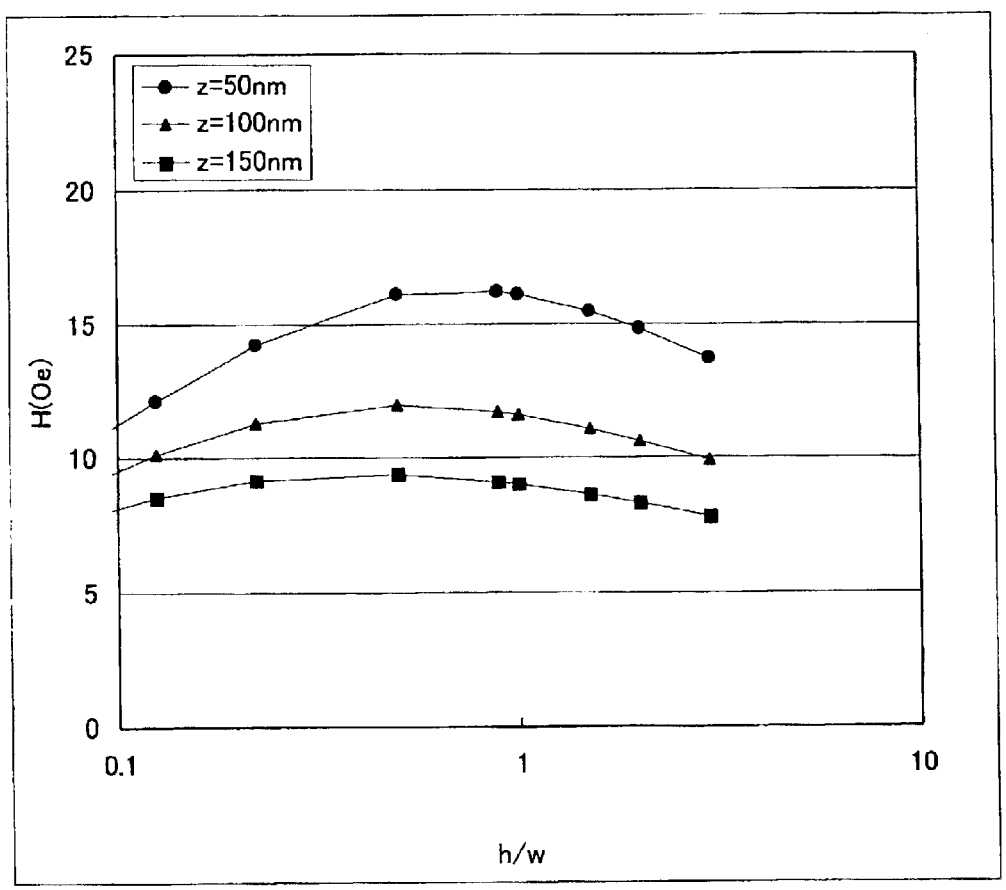
FIG. 13 is a graphical representation showing the magnetic field distribution where the width and thickness of the wiring are changed while setting a cross section area constant.

FIG. 13 is a graphical representation showing the magnetic field distribution where the width and thickness of the wiring are changed while setting a cross section area constant.

Here, cross section areas of wiring 22 and 23 were set to 0.02 $\mu m^2$, and the material thereof is copper (Cu) and the current passed to wiring is 1 mA. The horizontal axis of FIG. 13 corresponds to the ratio (aspect ratio) of thickness to the width of wiring, and a vertical axis corresponds to the intensity of a magnetic field. In this figure, each case where the distance Z from wiring is 50 nm, 100 nm, and 150 nm is plotted.

From the result, it turns out that the aspect ratio at which the peak of a magnetic field is obtained becomes small as the distance Z from the wiring becomes large. And when Distance Z is 150 nm, it turns out that the maximum generating magnetic field is obtained for an aspect ratio in the about 0.5. That is, in the position of a magnetic record layer, when the ratio of width and thickness is 2:1, a magnetic field can be generated most efficiently.

On the other hand, as shown in FIGS. 4A and 4B, the case where the cross section of wirings 22 and 23 is a trapezoid-like is explained.

Figure 14:
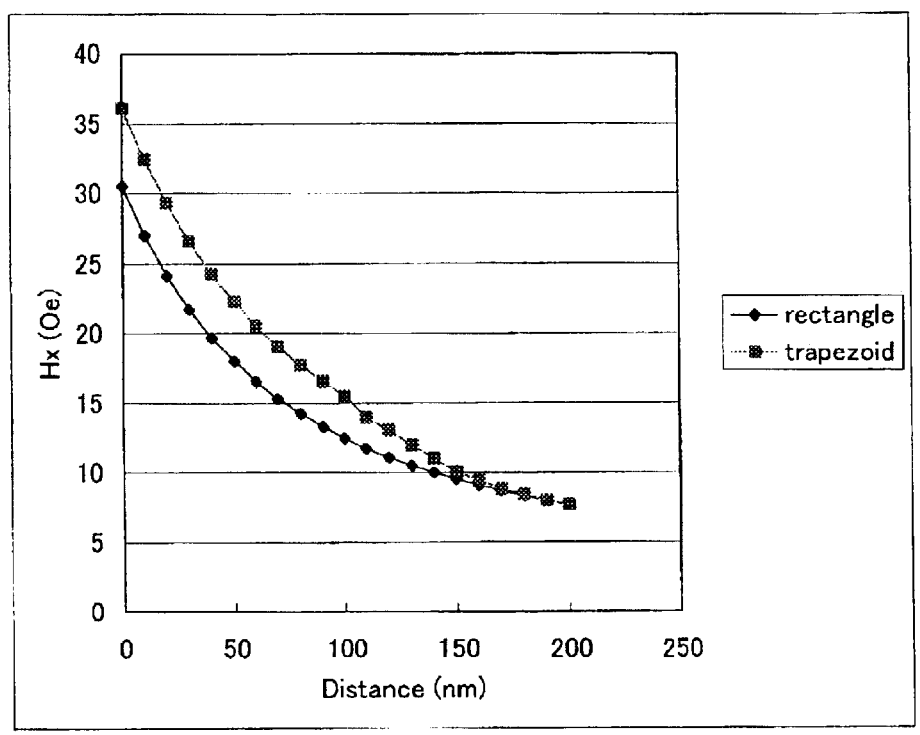
FIG. 14 is a graphical representation which plotted the generating magnetic field, respectively about the cases where the cross sectional shapes of wiring are a rectangle and a trapezoid.

FIG. 14 is a graphical representation which plotted the generating magnetic field, respectively about the cases where the cross sectional shapes of wiring are a rectangle and a trapezoid. Here, the material of wiring is copper (Cu), the cross section area is set to 0.04 $\mu m^2$, and current is set to 1 mA.

Moreover, the ratio of the longer side and shorter side is set to 3:1 in the case of the trapezoid cross section. Moreover, the cross section areas of the compared rectangle and a trapezoid are set to be the same.

From FIG. 14, it turns out that the generating magnetic field of the wiring having a trapezoid cross section is higher if the distance is in the range up to 200 nm. Especially, when distance is 50 nm or less, as for a trapezoid-like cross section, the magnetic field of about 1.3 times or more in the case of a rectangle cross section is obtained.

Second Example

Next, it explains in more detail about the magnetic field intensity in the case of making cross sectional shape of wiring into the shape of a trapezoid as the second example of the invention.

Figure 15:
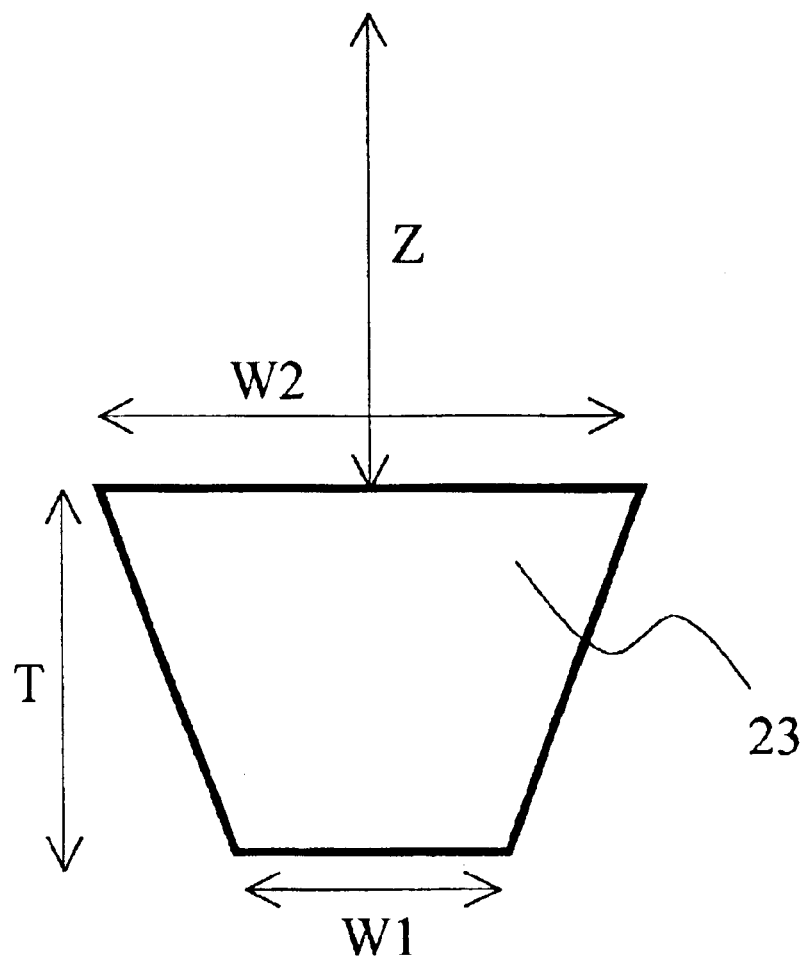
FIG. 15 is a schematic diagram showing the cross section of the write-in wiring 23.

FIG. 15 is a schematic diagram showing the cross section of the write-in wiring 23. That is, wiring 23 has a trapezoid section. And the length of the shorter side is set to W1, the length of the longer side is set to W2, and height (thickness) is set to T.

The Inventors have investigated the intensity of the magnetic field formed by passing current to this wiring 23 as a function of the distance Z from wiring.

Figure 16:
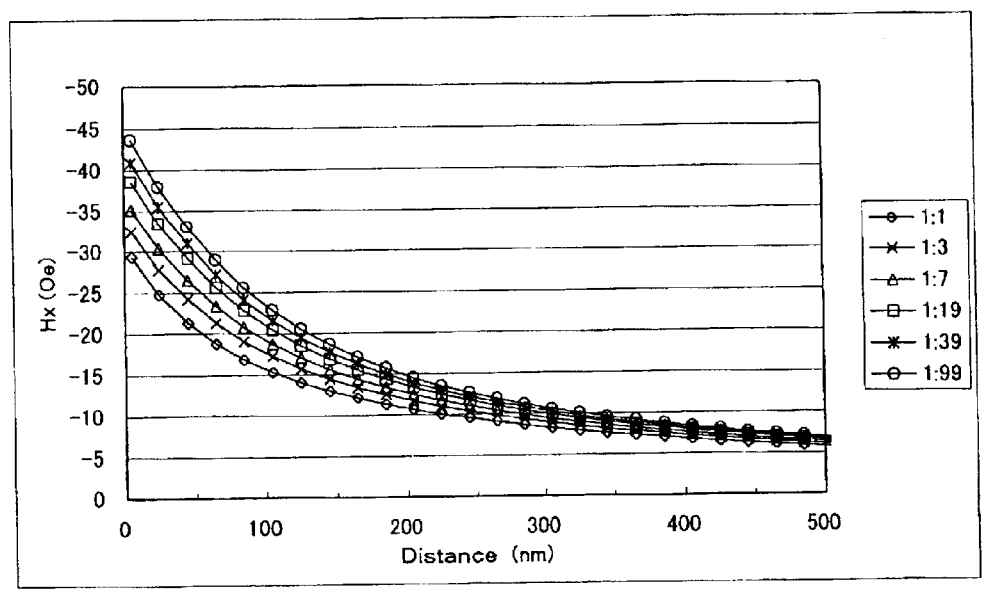
FIG. 16 is a graphical representation showing the intensity of the current magnetic field at the distance Z from wiring 23.

FIG. 16 is a graphical representation showing the intensity of the current magnetic field at the distance Z from wiring 23. That is, the horizontal axis of this figure shows the distance Z from wiring 23, and a vertical axis shows magnetic field intensity. Here, the cross section area of wiring 23 is set to 0.04 square microns, height (thickness) T is set to 0.4 microns, and the current passed to wiring 23 is set to 1 mA.

In FIG. 16, six different cases are plotted, that is, the ratio of the shorter side W1 and the longer side W2, W1:W2, being 1:1, 1:3, 1:7, 1:9, 1:39 and 1:99.

As shown in FIG. 16, stronger magnetic field can be obtained in the case of trapezoid (W1:W2≠1:1) than in the case of rectangle (W1:W2=1:2). Moreover, as W2 becomes larger compared to W1, the magnetic field becomes stronger.

Figure 17:
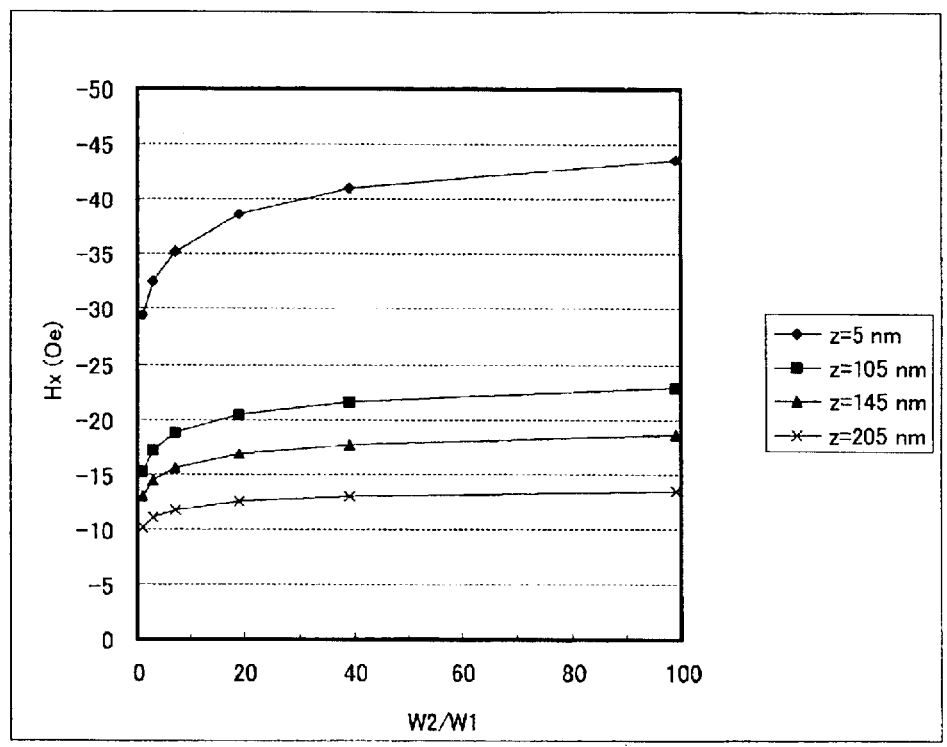
FIG. 17 is a graphical representation by which the relation of the current magnetic field to W2/W1 is plotted.

FIG. 17 is a graphical representation by which the relation of the current magnetic field to W2/W1 is plotted. That is, the horizontal axis of this figure shows the ratios W2/W1 of the longer side W2 and the shorter side W1, and a vertical axis shows a current magnetic field.

In this figure, the cases where the distance Z from wiring 23 are 5, 105, 145 and 205 nm are plotted, respectively.

From this figure, it turns out that if W2/W1 becomes large, a current magnetic field also becomes large gradually saturates. Therefore, in order to generate the largest possible magnetic field, what is necessary is to make the ratio W2/W1 larger. According to this approach, the ultimate shape of the cross section of the wiring would be an inverse triangle.

In the magnetic memory of this embodiment, the wirings 22 and 23 for writing provided in the upper and lower sides of the magnetoresistance effect element 21 are used.

Generally, the distances from the magnetoresistance effect element 21 to these wirings 22 and 23 are not equal. Therefore, when passing comparable write-in current to these wirings 22 and 23, it is desirable by changing the cross sectional shapes of wirings 22 and 23 according to the distance to the magnetoresistance effect element 21 in order to apply the equal magnetic fields to the element 21.

Figure 18A:
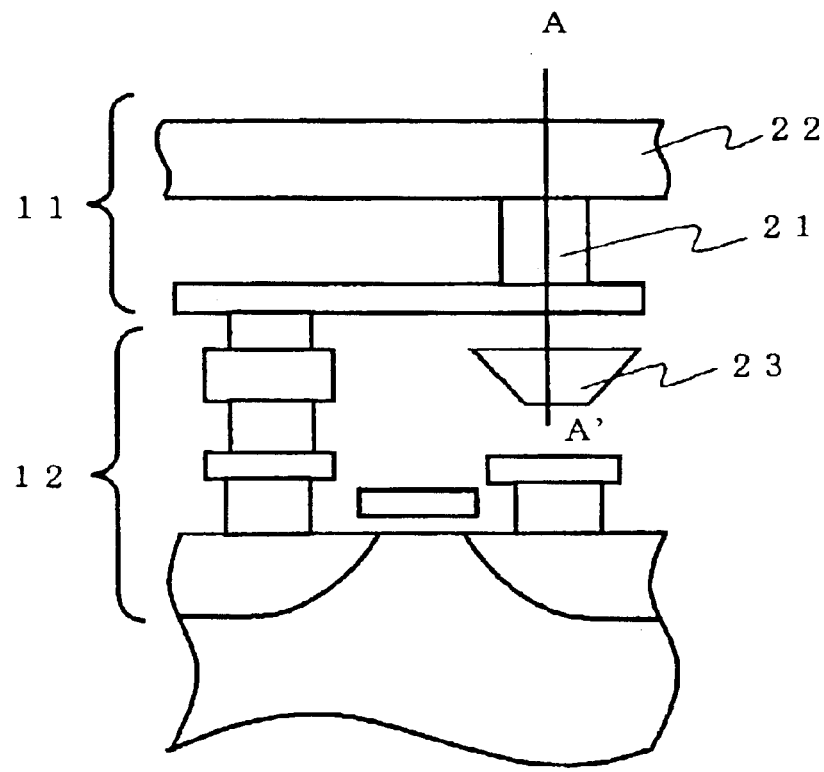
FIG. 18A is a schematic diagram which shows the magnetic memory where the cross sectional shapes of upper and lower wirings differ each other.

FIG. 18A is a schematic diagram which shows the magnetic memory where the cross sectional shapes of upper and lower wirings differ each other.

Figure 18B:
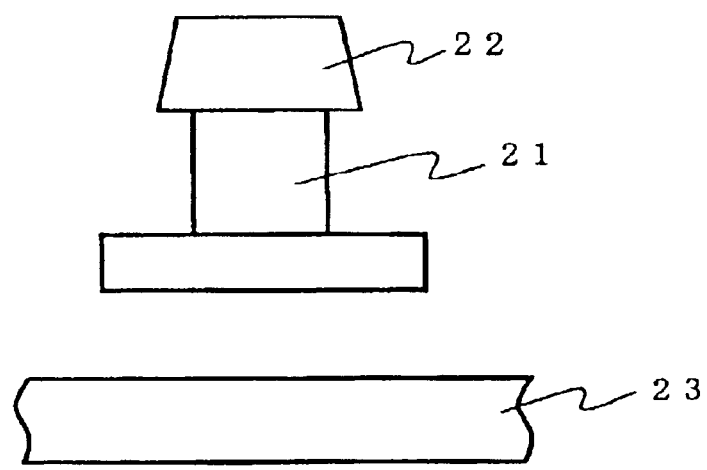
FIG. 18B is the A–A' line sectional view.

FIG. 18B is the A–A' line sectional view.

As exemplified on these drawings, the wirings 22 and 23 of the upper and lower sides of the magnetoresistance effect element 21 are not in the equal distances from the magnetoresistance effect element 21 in many cases.

For example, in FIGS. 18A and 18B, the lower wiring 23 is provided remoter from the element 21. In such a case, shape of the cross section of the upper wiring 22 can be made into a rectangle, and the cross section of the lower wiring 23 can be made into a reverse trapezoid.

Or it is desirable to make the cross section of the upper wiring into a trapezoid where the ratio of the longer side to the shorter side, W2/W1, is smaller, and to make the cross section of the lower wiring into a reverse trapezoid where the ratio of the longer side to the shorter side, W2/W1, is larger.

If it does in this way, the magnetic field given to the magnetoresistance effect element 21 from the upper and lower wirings 22 and 23 can be equalized.

Figure 19A:
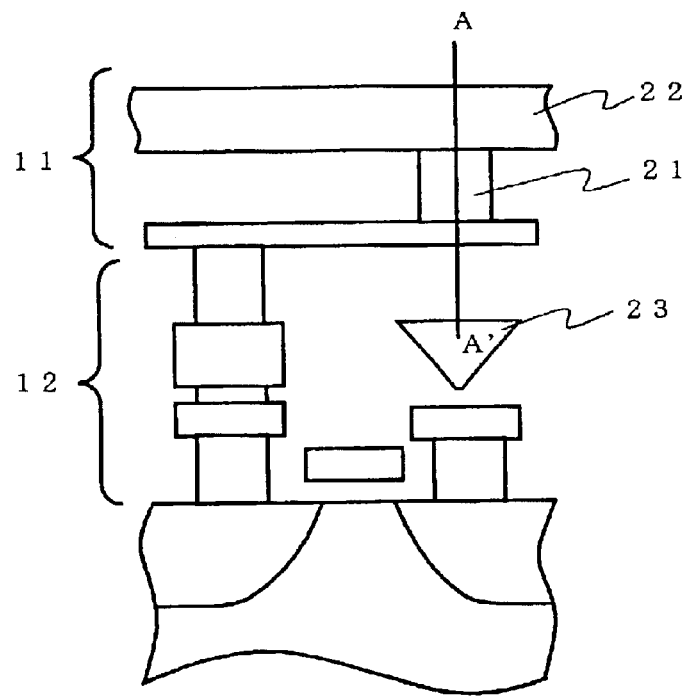
FIGS. 19A and 19B are schematic diagrams showing the case where the lower wiring 23 separates from the magnetoresistance effect element 21 further.
Figure 19B:
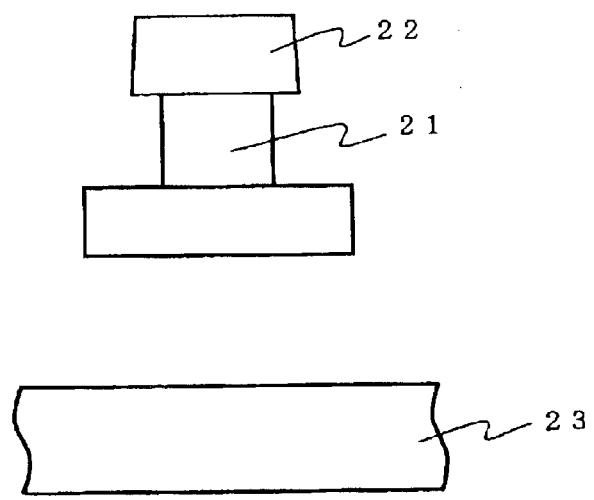

FIGS. 19A and 19B are schematic diagrams showing the case where the lower wiring 23 separates from the magnetoresistance effect element 21 further.

In this case, it is possible by making cross sectional shape of wiring 23 into the shape of a triangle to obtain an appropriate magnetic field intensity at the magnetoresistance effect element 21. In contrast to the examples shown in FIGS. 18A through 19B, when the upper wiring 22 is further from the magnetoresistance effect element 21, the cross section of the wiring 22 may be a trapezoid where W2/W1 is larger or a triangle.

What is necessary is just to determine the shape of the cross section of write-in wiring in consideration of the distance to the magnetic-recording layer of the magnetoresistance effect element 21. As explained above, when the distances to the upper and lower wirings 22 and 23 from the magnetoresistance effect element 21 are not equal, equalized current magnetic fields from these wirings 22 and 23 can be obtained at the magnetoresistance effect element 21 by differing the shapes of the cross sections of these wirings 22 and 23 suitably.

Third Example

Next, the example having the covering layer SM is explained as the third example of the invention.

Figure 20A:
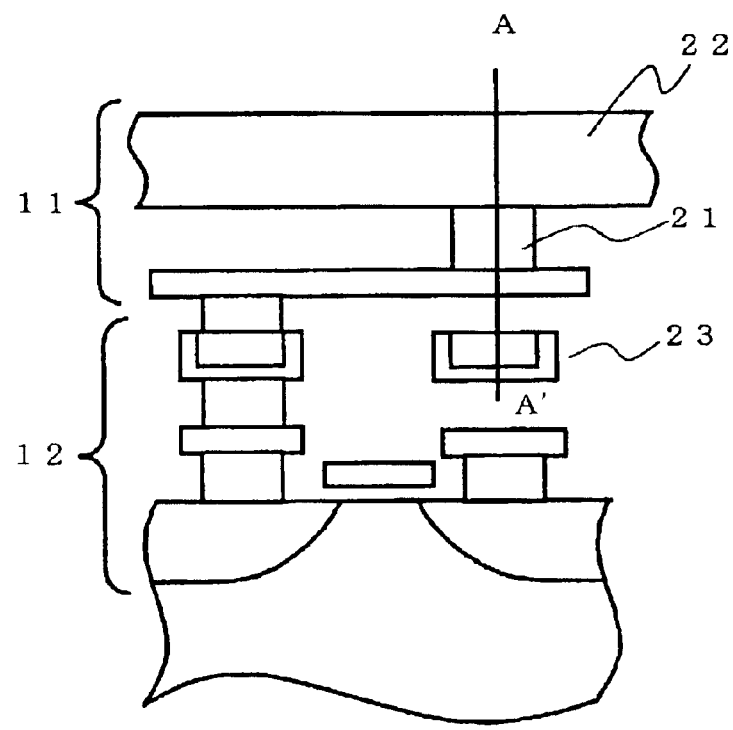
FIGS. 20A and 20B are schematic diagrams showing the cell structure of the magnetic memory of the example.
Figure 20B:
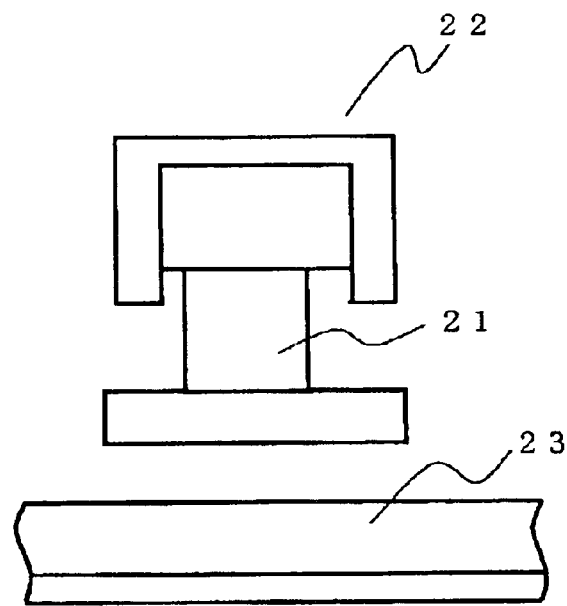

FIGS. 20A and 20B are schematic diagrams showing the cell structure of the magnetic memory of this example. The same symbol is given to the similar element as what was mentioned above about FIGS. 1A through 19B with regard to FIGS. 20A and 20B, and detailed explanation is omitted.

In this case of the operation, cross sectional shape of wiring 22 is made into the shape of a rectangle with a width of 200 nm and a thickness of 100 nm, which consists of copper (Cu), and the circumference is covered with the nickel iron (NiFe) having a relative permeability of 1000, and the projecting part P whose amount of projection is 100 nm is provided.

Figure 21:
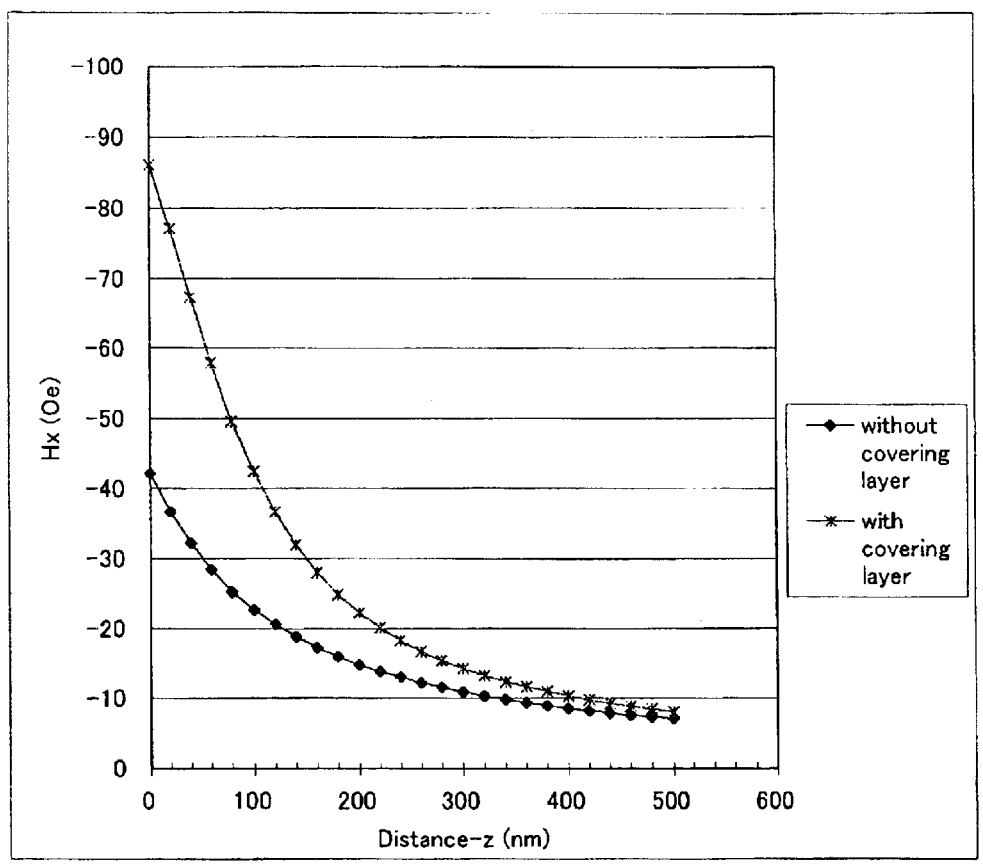
FIG. 21 is a graphical representation which shows the distribution of the generating magnetic field when passing 2 mA write-in current to such wiring 22.

FIG. 21 is a graphical representation which shows the distribution of the generating magnetic field when passing 2 mA write-in current to such wiring 22. The figure also shows the comparative case where the covering layer SM is not formed.

From this result, it turns out that a generating magnetic field becomes about 1.7 times larger by surrounding the circumference of wiring by the covering layer SM which consists of the high magnetic-permeability magnetic substance.

Heretofore, embodiments of the invention have been explained in detail with reference to some specific examples. The invention, however, is not limited to these specific examples.

For example, material, shape and thickness of the ferromagnetic layer, anti-ferromagnetic layer, insulating film and ferromagnetic film of the magnetoresistance effect element according to the invention may be appropriately selected by those skilled in the art within the known techniques to carry out the invention as taught in the specification and obtain equivalent effects.

Further, also concerning the magnetic memory according to the invention, those skilled in the art will be able to carry out the invention by appropriately selecting a material or a structure within the known techniques.

While the present invention has been disclosed in terms of the embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A magnetic memory comprising:

a magnetoresistance effect element having a magnetic rewording layer;

a first writing wiring extending in a first direction on or below the magnetoresistance effect element, a center of gravity of an axial cross section of the wiring being apart from a center of thickness at the center of gravity, and the center of gravity being eccentric toward the magnetoresistance effect element;

a writing circuit configured to pass a current through the first writing wiring in order to record an information in the magnetic recording layer by a magnetic field generated by the current; and wherein a face of the wiring which counters the magnetoresistance effect element is curving to a concave when taken from the magnetoresistance effect element.

2. A magnetic memory comprising:

a magnetoresistance effect element having a magnetic rewording layer;

a first writing wiring extending in a first direction on or below the magnetoresistance effect element, a center of gravity of an axial cross section of the wiring being apart from a center of thickness at the center of gravity, and the center of gravity being eccentric toward the magnetoresistance effect element;

a writing circuit configured to pass a current through the first writing wiring in order to record an information in the magnetic recording layer by a magnetic field generated by the current; and wherein the axial cross section of the wiring is formed into a shape of a trapezoid where a longer side is closer to the magnetoresistance effect element.

3. A magnetic memory comprising:

a magnetoresistance effect element having a magnetic rewording layer;

a first writing wiring extending in a first direction on or below the magnetoresistance effect element, a center of gravity of an axial cross section of the wiring being apart from a center of thickness at the center of gravity, and the center of gravity being eccentric toward the magnetoresistance effect element;

a writing circuit configured to pass a current through the first writing wiring in order to record an information in the magnetic recording layer by a magnetic field generated by the current; and wherein the axial cross section is formed into a shape of which a side remoter from the magnetoresistance effect element is an arc.

4. A magnetic memory comprising:

a magnetoresistance effect element having a magnetic rewording layer;

a first writing wiring extending in a first direction on or below the magnetoresistance effect element, a center of gravity of an axial cross section of the wiring being apart from a center of thickness at the center of gravity, and the center of gravity being eccentric toward the magnetoresistance effect element;

a writing circuit configured to pass a current through the first writing wiring in order to record an information in the magnetic recording layer by a magnetic field generated by the current; and further comprising a covering layer provided on the first writing wiring, wherein the covering layer is provided on at least one of both sides and a face remoter from the magnetoresistance effect element of the first writing wiring.

5. A magnetic memory comprising:

a magnetoresistance effect element having a magnetic recording layer;

a first writing wiring extending in a first direction on or below the magnetoresistance effect element, an axial cross section of the wiring being formed into a shape which is asymmetric in a vertical direction and a width of the shape being broader toward the magnetoresistance effect element; and a writing circuit configured to pass a current through the first writing wiring in order to record an information in the magnetic recording layer by a magnetic field generated by the current.

6. A magnetic memory according to claim 5, wherein a face of the wiring which counters the magnetoresistance effect element is curving to a concave when taken from the magnetoresistance effect element.

7. A magnetic memory according to claim 5, wherein the axial cross section of the wiring is formed into a shape of a trapezoid where a longer side is closer to the magnetoresistance effect element.

8. A magnetic memory according to claim 5, wherein the axial cross section is formed into a shape of which a side remoter from the magnetoresistance effect element is an arc.

9. A magnetic memory according to claim 5, further comprising a covering layer provided on the first writing wiring, wherein the covering layer is provided on at least one of both sides and a face remoter from the magnetoresistance effect element of the first writing wiring.

10. A magnetic memory according to claim 5, wherein the shape of the axial cross section of the wiring is substantially triangle.

11. A magnetic memory comprising:

a magnetoresistance effect element having a magnetic recording layer;

a first writing wiring extending in a first direction below the magnetoresistance effect element, a center of gravity of an axial cross section of the first writing wiring being apart from a center of thickness at the center of gravity, and the center of gravity being eccentric toward the magnetoresistance effect element;

a second writing wiring extending in a second direction to intersect the first direction on the magnetoresistance effect element, a center of gravity of an axial cross section of the second writing wiring being apart from a center of thickness at the center of gravity, and the center of gravity being eccentric toward the magnetoresistance effect element;

a writing circuit configured to pass currents through the first and second writing wirings in order to record an information in the magnetic recording layer by magnetic fields generated by the currents; and further comprising a reading wiring extending in a third direction to supply a sense current to the magnetoresistance effect element, wherein an axial cross section of the reading wiring is formed into a shape which is symmetric in a vertical direction.

12. A magnetic memory comprising:

a magnetoresistance effect element having a magnetic recording layer;

a first writing wiring extending in a first direction below the magnetoresistance effect element, a center of gravity of an axial cross section of the first writing wiring being apart from a center of thickness at the center of gravity, and the center of gravity being eccentric toward the magnetoresistance effect element;

a second writing wiring extending in a second direction to intersect the first direction on the magnetoresistance effect element, a center of gravity of an axial cross section of the second writing wiring being apart from a center of thickness at the center of gravity, and the center of gravity being eccentric toward the magnetoresistance effect element;

a writing circuit configured to mass currents through the first and second writing wirings in order to record an information in the magnetic recording layer by magnetic fields generated by the currents; and wherein the axial cross section of at least one of the first and second writing wirings is formed into a shape of a trapezoid where a longer side is closer to the magnetoresistance effect element.

13. A magnetic memory comprising:

a magnetoresistance effect element having a magnetic recording layer;

a first writing wiring extending in a first direction below the magnetoresistance effect element, a center of gravity of an axial cross section of the first writing wiring being apart from a center of thickness at the center of gravity, and the center of gravity being eccentric toward the magnetoresistance effect element;

a second writing wiring extending in a second direction to intersect the first direction on the magnetoresistance effect element, a center of gravity of an axial cross section of the second writing wiring being apart from a center of thickness at the center of gravity, and the center of gravity being eccentric toward the magnetoresistance effect element;

a writing circuit configured to pass currents through the first and second writing wirings in order to record an information in the magnetic recording layer by magnetic fields generated by the currents; and wherein the axial cross section of at least one of the first and second writing wirings is formed into a shape of which a side remoter from the magnetoresistance effect element is an arc.

14. A magnetic memory comprising:

a magnetoresistance effect element having a magnetic recording layer;

a first writing wiring extending in a first direction below the magnetoresistance effect element, a center of gravity of an axial cross section of the first writing wiring being apart from a center of thickness at the center of gravity, and the center of gravity being eccentric toward the magnetoresistance effect element;

a second writing wiring extending in a second direction to intersect the first direction on the magnetoresistance effect element, a center of gravity of an axial cross section of the second writing wiring being apart from a center of thickness at the center of gravity, and the center of gravity being eccentric toward the magnetoresistance effect element;

a writing circuit configured to pass currents through the first and second writing wirings in order to record an information in the magnetic recording layer by magnetic fields generated by the currents; and further comprising a covering layer provided on at least one of the first and second writing wirings, wherein the covering layer is formed on at least one of both sides and a face remoter from the magnetoresistance effect element of the wiring.

15. A magnetic memory according to claim 14, wherein the covering layer has a projecting part which projects toward the magnetoresistance effect element from the writing wiring on which the covering layer is provided.

16. A magnetic memory comprising:

a magnetoresistance effect element having a magnetic recording layer;

a first writing wiring extending in a first direction below the magnetoresistance effect element, an axial cross section of the first writing wiring being formed into a shape which is asymmetric in a vertical direction and a width of the shape being broader toward the magnetoresistance effect element;

a second writing wiring extending in a second direction to intersect the first direction on the magnetoresistance effect element, an axial cross section of the second writing wiring being formed into a shape which is asymmetric in a vertical direction and a width of the shape being broader toward the magnetoresistance effect element; and a writing circuit configured to pass currents through the first and second writing wirings in order to record an information in the magnetic recording layer by magnetic fields generated by the currents.

17. A magnetic memory according to claim 16, further comprising a reading wiring extending in a third direction to supply a sense current to the magnetoresistance effect element, wherein an axial cross section of the reading wiring is formed into a shape which is symmetric in a vertical direction.

18. A magnetic memory according to claim 16, wherein the axial cross section of at least one of the first and second writing wirings is formed into a shape of a trapezoid where a longer side is closer to the magnetoresistance effect element.

19. A magnetic memory according to claim 18, wherein a ratio W2/W1 is different from a ratio W4/W3 where W1 is a length of a shorter side and W2 is a length of a longer side of the trapezoid in the first writing wiring, and W3 is a length of a shorter side and W4 is a length of a longer side of the trapezoid in the second writing wiring.

20. A magnetic memory according to claim 19, wherein larger one of the ratios W2/W1 and W4/W3 corresponds to the one of the first and second writing wirings which is remoter from the magnetoresistance effect element.

21. A magnetic memory according to claim 16, wherein the axial cross section of at least one of the first and second writing wirings is formed into a shape of which a side remoter from the magnetoresistance effect element is arc.

22. A magnetic memory according to claim 16, further comprising a covering layer provided on at least one of the first and second writing wirings, wherein the covering layer is formed on at least one of both sides and a face remoter from the magnetoresistance effect element of the wiring.

23. A magnetic memory according to claim 22, wherein the covering layer has a projecting part which projects toward the magnetoresistance effect element from the writing wiring on which the covering layer is provided.

24. A magnetic memory comprising:

a magnetoresistance effect element having a magnetic recording layer;

a first writing wiring extending in a first direction below the magnetoresistance effect element, a second writing wiring extending in a second direction to intersect the first direction on the magnetoresistance effect element; and a writing circuit configured to pass currents through the first and second writing wirings in order to record an information in the magnetic recording layer by magnetic fields generated by the currents, a shape of an axial cross section of the first writing wiring being different from a shape of an axial cross section of the second writing wiring, each of the shapes of the axial cross sections of the first and second writing wirings being rectangular or trapezoidal, and having a first side closer to the magnetoresistance effect element and a second side remoter from the magnetoresistance effect element, one of the first and second writing wirings being remoter from the magnetoresistance effect element than another of the first and second writing wirings, and the remoter wiring having a larger ratio of length of the first side to the second side than the ratio of another of the first and second writing wirings.

25. A magnetic memory according to claim 16, wherein at least one of the shapes of the axial cross sections of the first and second writing wirings is substantially triangle.

* * * * *